United States Patent
Huang et al.

(10) Patent No.: US 8,044,644 B2
(45) Date of Patent: Oct. 25, 2011

(54) SYMMETRIC SAMPLE AND HOLD OVER-CURRENT SENSING METHOD AND APPARATUS

(75) Inventors: Jin-Biao Huang, Amherst, NH (US); Joseph M. Khayat, Bedford, NH (US); Fei Ma, Lexington, MA (US)

(73) Assignee: Texas Instruments Incorporated, Dallas, TX (US)

( * ) Notice: Subject to any disclaimer, the term of this patent is extended or adjusted under 35 U.S.C. 154(b) by 382 days.

(21) Appl. No.: 12/417,858

(22) Filed: Apr. 3, 2009

(65) Prior Publication Data

US 2010/0253296 A1    Oct. 7, 2010

(51) Int. Cl.
*G05F 1/59* (2006.01)
(52) U.S. Cl. .......................... 323/271; 323/283; 323/284
(58) Field of Classification Search .................. 323/271, 323/282, 283, 284, 288
See application file for complete search history.

(56) References Cited

U.S. PATENT DOCUMENTS

| | | | |
|---|---|---|---|
| 5,808,455 A * | 9/1998 | Schwartz et al. | 323/271 |
| 6,430,070 B1 * | 8/2002 | Shi et al. | 363/97 |
| 7,019,507 B1 * | 3/2006 | Dittmer et al. | 323/284 |
| 7,045,993 B1 | 5/2006 | Tomiyoshi | |
| 7,119,522 B1 | 10/2006 | Tomiyoshi | |
| 7,372,238 B1 | 5/2008 | Tomiyoshi | |
| 7,449,869 B2 * | 11/2008 | Markowski | 323/283 |
| 7,479,770 B2 * | 1/2009 | Kohout et al. | 323/271 |
| 7,741,820 B2 * | 6/2010 | Huang et al. | 323/271 |
| 2008/0129257 A1 * | 6/2008 | Lee | 323/271 |
| 2008/0197823 A1 * | 8/2008 | Crowther et al. | 323/271 |
| 2009/0224732 A1 * | 9/2009 | Kudo et al. | 323/271 |
| 2010/0188062 A1 * | 7/2010 | Candage et al. | 323/271 |
| 2011/0128654 A1 * | 6/2011 | Wu | 361/18 |

\* cited by examiner

*Primary Examiner* — Jeffrey Sterrett
(74) *Attorney, Agent, or Firm* — John J Patti; Wade J. Brady, III; Frederick J. Telecky, Jr.

(57) ABSTRACT

An over-current condition is detected in a synchronous DC-DC converter by sampling and holding a measured load current value. The load current is sampled while a low-side transistor is ON and then held when the low-side transistor is OFF. The held value is compared to a threshold value while the low-side transistor is OFF. The comparison occurs during the portion of the cycle when the low-side transistor is OFF so that a comparator has sufficient time in which to detect the over-current condition, even in high duty cycle applications.

18 Claims, 4 Drawing Sheets

SYMMETRIC SAMPLE AND HOLD OVER-CURRENT SENSING METHOD AND APPARATUS

TECHNICAL FIELD

The present invention relates generally to DC-DC converters and, more particularly, to monitoring a load current to detect an over-current condition or short-current condition.

BACKGROUND

As part of the operation of a synchronous DC-DC converter, an over-current condition is generally monitored to prevent damage to the device and the system. An impedance of a low-side transistor during actuation is commonly used for loss-less over-current sensing and protection in synchronous DC-DC buck converters. The measured current, when the low-side transistor is turned ON, is compared with a preset threshold. A fixed leading edge blanking time is usually added for filtering out ringing noise that may be present when the low-side transistor switches, or is turned, ON.

Additionally, sample-and-hold circuit has been employed in various DC-DC converters. One conventional DC-DC converter arrangement is shown in U.S. Pat. Nos. 7,372,238; 7,372,238; 7,045,993; and 7,119,522 by Tomiyoshi. This arrangement employs a sample-and-hold circuit with a DC-DC converter, but it is used for emulated current mode control, not for over-current protection. In particular, this arrangement employs a front-end sense amplifier and a switch-capacitor arrangement to store a current sense voltage so as to adjust pulse width modulations (PWM) signal in an attempt to reduce sub-harmonic oscillations in a current mode.

SUMMARY

A preferred embodiment of the present invention, accordingly, provides an apparatus for converting a first voltage input at an input node to a second voltage that is output at an output node. The apparatus comprises a first switch that is coupled to the input node; a second switch that is coupled to the first switch; an inductor that is coupled to a node between the first and second switches and that is coupled to the output node; and a controller. The controller includes a pulse width modulation (PWM) logic that is coupled to the first and the second switches and that generates actuation signals for the first and second switches; a sample-and-hold circuit that is coupled to the node between the first and second switches and that is coupled to the PWM logic, wherein the sample-and-hold circuit receives the actuation signals for the first and second switches; and a comparator that is coupled to the sample-and-hold circuit and that is coupled to the PWM logic, wherein the comparator compares an output from the sample-and-hold circuit to a predetermined threshold to determine whether the apparatus has reached an over-current condition, and wherein the comparator outputs an over-current signal to the PWM if the over-current condition has been reached.

In accordance with another preferred embodiment of the present invention, the first and second switches are FETs.

In accordance with another preferred embodiment of the present invention, wherein the sample-and-hold circuit further comprises a third switch that is coupled to the node between the first and the second switches; a fourth switch that is coupled to between the third switch and ground; a fifth switch that is coupled to the comparator; a sixth switch that is coupled between the fifth switch and ground; a capacitor that is coupled to a node between the third and fourth switches and that is coupled to a node between the fifth and sixth switches; and a signal control circuit that is coupled to the PWM logic and that is coupled to each of the third, forth, fifth, and sixth switches, wherein the signal control logic is adapted to issue a sample signal to the third and sixth switches to store an inductor current value on the capacitor, and wherein the signal control logic is adapted to issue a hold signal to the fourth and fifth switches to provide the inductor value stored on the capacitor to the comparator.

In accordance with another preferred embodiment of the present invention, third, fourth, fifth, and sixth switches are FETs.

In accordance with another preferred embodiment of the present invention, the comparator is a digital comparator.

In accordance with another preferred embodiment of the present invention, the sample-and-hold circuit further comprises digital signal control circuit that is coupled to the PWM logic; and an analog-to-digital sample-and-hold circuit that is coupled to the node between the first and second switches, the digital signal control circuit, and the digital comparator.

In accordance with another preferred embodiment of the present invention, the digital signal control circuit is a field programmable gate array (FPGA).

In accordance with another preferred embodiment of the present invention, the apparatus further comprises a capacitor that is coupled between the output node and ground.

In accordance with another preferred embodiment of the present invention, the apparatus further comprises a capacitor that is coupled between the input node and ground.

In accordance with another preferred embodiment of the present invention, a controller for a DC-DC converter is provided. The converter comprising a pulse width modulation (PWM) logic that receives a clock signal and generates actuation signals; a sample-and-hold circuit that receives the actuation signals and that receives an inductor current value, wherein the sample-and-hold circuit is adapted to store and to output the inductor current value; and a comparator that receives the inductor current value from the sample-and-hold circuit, that compares the inductor current value to a predetermined threshold to determine whether the converter has reached an over-current condition, and that outputs an over-current signal to the PWM logic if the over-current condition has been reached.

In accordance with another preferred embodiment of the present invention, a method for operating a DC-DC converter having a high-side transistor and a low-side transistor is provided. The method comprising the steps of actuating the low-side transistor; sampling an inductor current value while the low-side transistor is actuated; comparing the sampled inductor current value to a predetermined threshold to determine whether the converter has reached an over-current condition; indicating the over-current condition to PWM logic when reached; and adjusting the ON times for at least one of the high-side and low-side transistors in response to the over-current condition.

In accordance with another preferred embodiment of the present invention, the step of sampling the inductor current value while the low-side transistor is actuated further comprises the step of actuating first and second sample transistors to allow a capacitor to receive the inductor current value.

In accordance with another preferred embodiment of the present invention, the step of method further comprises the step of actuating first and second hold transistors when the high-side transistor is actuated to allow a comparator to receive the sampled inductor current value.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
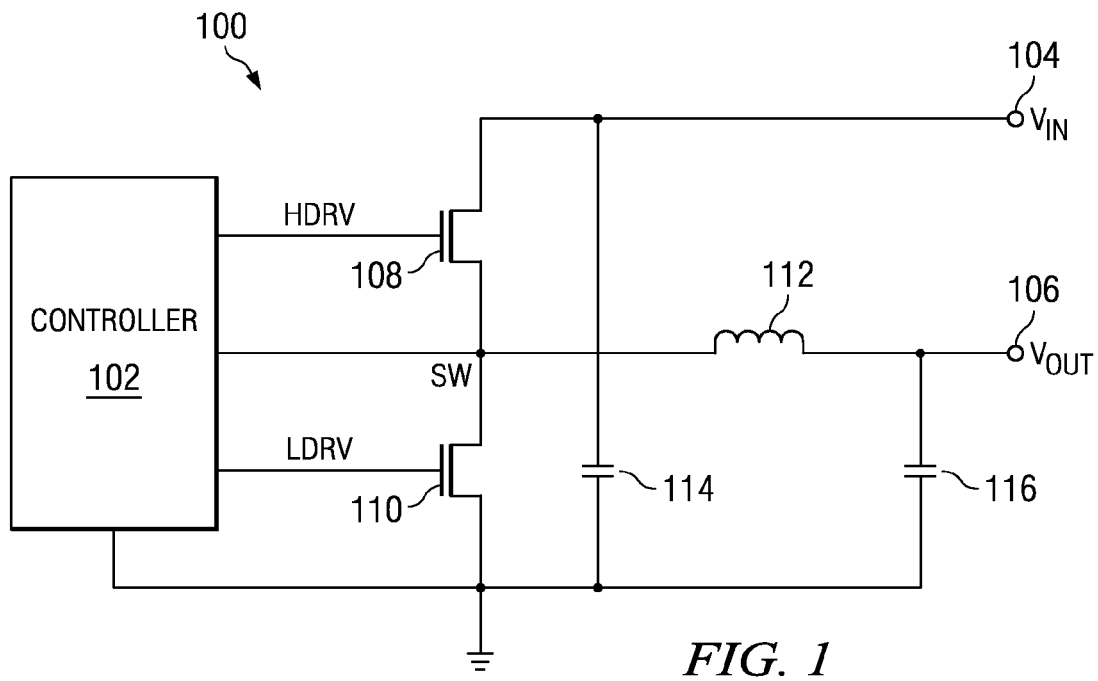
FIG. 1 is a schematic diagram of a DC-DC converter in accordance with a preferred embodiment of the present invention.

Refer now to the drawings wherein depicted elements are, for the sake of clarity, not necessarily shown to scale and wherein like or similar elements are designated by the same reference numeral through the several views.

Referring now to FIG. 1, the reference numeral 100 generally designates a DC-DC converter or system. System 100 generally comprises a buck controller 102, switches 108 and 110, inductor 112, and capacitors 114 and 116. Preferably, system 100 actuates switches 108 and 110 (which are generally referred to as the high-side and low-side transistors or FETs respectively) with high-side drive signal HDRV and low-side drive signal LDRV to convert an input voltage VIN (which can be filtered by capacitor 114) into an output voltage $V_{OUT}$. To accomplish this, the high-side transistor 108 is positioned between and coupled to the input voltage node 104 (which receives the input voltage VIN) and a switch node SW, and the low-side transistor 110 is positioned between and coupled to the switch node SW and ground. As the transistors 108 and 110 are actuated and deactuated, the inductor 112, which is positioned between and coupled to the switch node SW and the output voltage node 106. The inductor 112, along output filter capacitor 116, can then generate the output voltage $V_{OUT}$ at output node 106.

As part of the functionality of the controller 102, it provides over-current protection. In conventional systems a fixed leading edge blanking time is generally employed to filter out ringing; however, under these circumstances, there is both a fixed comparator response time and a certain amount of sensing uncertainty because the current sense point could be anywhere in the inductive current's down slope depending on the duty cycle of the converter. This uncertainty can result in inconsistent and inaccurate over-current sensing. There is also a risk that an over-current condition may not be sensed for high duty cycle applications because the comparator does not have enough time to respond after the fixed leading edge blanking time. Controller 102, though, can accurately measure for the over-current conditions even under high duty cycle applications and or high frequency applications.

Figure 2:
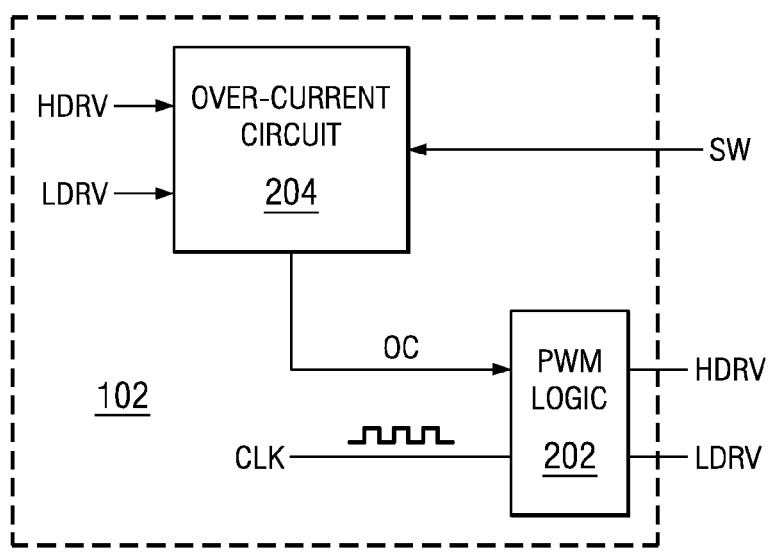
FIG. 2 is a block diagram of a portion of a controller of FIG. 1.

Turning to FIG. 2, the controller 102 can be seen in greater detail. Controller 102 generally comprises pulse width modulation (PWM) logic 202, and an over-current circuit 204. The PWM logic 202 generally provides the high-side and low-side drive signals HDRV and LDRV to the high-side transistor 108 and low-side transistor 110, while the over-current circuit 204 generates an over-current signal OC. Preferably, the over-current circuit 204 is coupled to the switch node SW and receives, as input, the two drive signals HDRV and LDRV, and the PWM logic 202 receives a clock signal CLK and the over-current signal OC. This arrangement allows the over-current circuit 204 to detect an over-current condition and provide an over-current signal OC to the PWM logic 202 to adjust the ON times of the high-side transistor 108 and to other control circuit(s) to make further decisions based on the duration of the over-current condition.

Figure 3:
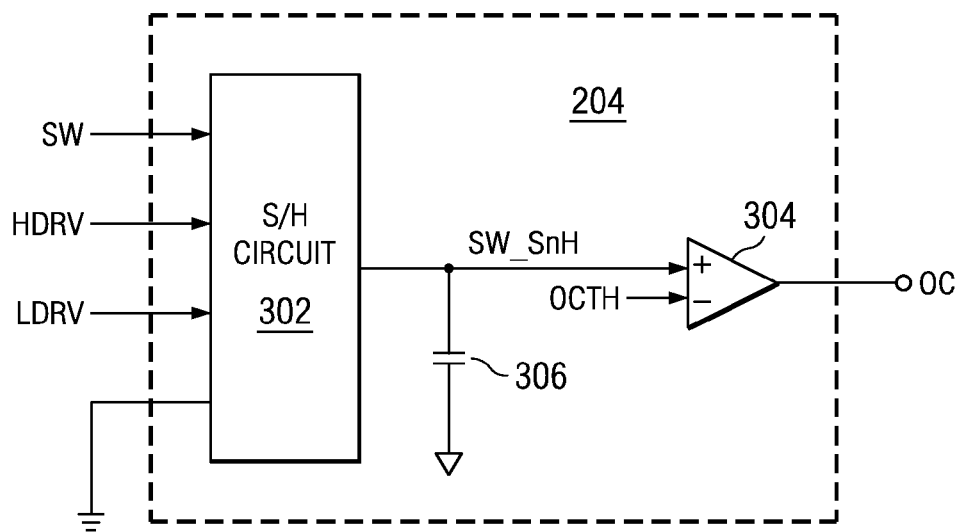
FIG. 3 is a block diagram of a portion of an over-current circuit of FIG. 2.

To accomplish this, over-current circuit 204 employs a "sample-and-hold" arrangement. As can be seen in FIG. 3, the over-current circuit 204 generally comprises a sample-and-hold (S/H) circuit 302 and a comparator 304. The S/H circuit 302 takes, as its inputs, the signals found at the switch node SW along with the high-side and low-side drive signals HDRV and LDRV. The S/H circuit 302 outputs a current value SW_SnH to comparator 304. An over-current threshold value OCTH (which is typically corresponds to an over-current $I_{OC}$ that is the desired average current $I_{AVG}$ minus one-half the ripple current $I_{RIP}$ or $I_{OC}=I_{AVG}-0.5*I_{RIP}$) is also provided to the comparator 304. Additionally, a filtering capacitor 306 may be provided between ground and the non-inverting input of the comparator 304; however, for a variety of applications, filtering capacitor 306 can be omitted.

Figure 4:
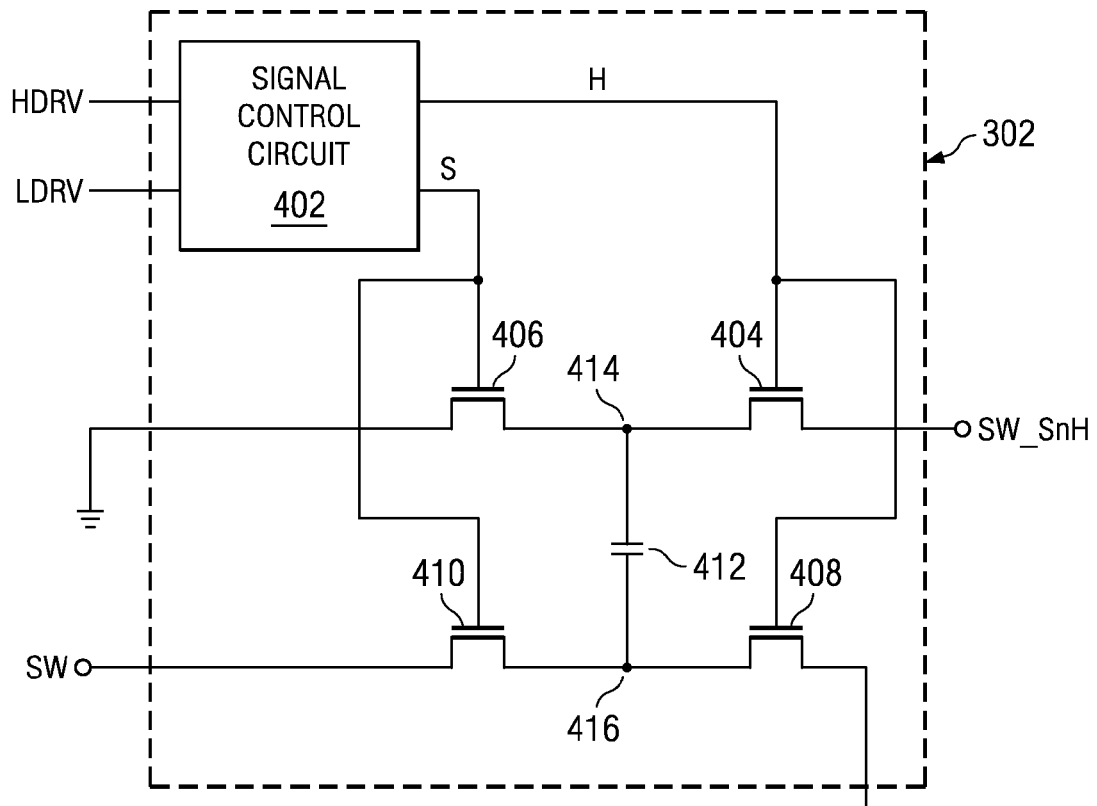
FIG. 4 is a block diagram of a portion of a sample-and-hold circuit of FIG. 3.

As can be seen in FIG. 4, the S/H circuit 302 generally comprises a signal control circuit 402, sample switches or transistor 406 and 410, hold switches or transistors 404 and 408, and holding capacitor 412. The signal control circuit 402 receives, as inputs, the high-side and low-side drive signals HDRV and LDRV and outputs a sample signal S and a hold signal H. A first hold transistor 404 (which is preferably a FET) and a first sample transistor 406 (which is preferably a FET) are generally positioned in series with one another between the output node SW_SnH and ground. A second hold transistor 408 (which is preferably a FET) and a second sample transistor 410 (which is preferably a FET) are generally positioned in series with one another between the switch node SW and ground. A first node 414 is located between the first sample transistor 406 and the first hold transistor 404 and a second node 416 is located between the second sample transistor 410 and the second hold transistor 408. Holding capacitor 412 is positioned between the first node 414 and the second node 416. The first and second sample transistors 406 and 410 are driven or actuated by the sample signal S and the first and second holding transistors 404 and 408 are driven or actuated by the hold signal H.

In operation, the sample transistors 406 and 410 are actuated to store or latch a value at node SW, while hold transistors 404 and 408 are actuated to hold the value at node SW and transmit the value to comparator 304. Thus, the arrangement of transistors 406, 408, 410, and 404 and capacitor 412 allow for a simple and direct arrangement to measure the value at node SW without a bulky sense amplifier. Additionally, holding capacitor 412 can convert the polarity during the when holding period begins, which essentially eliminates a need for extra and/or separate polarity reversing circuitry.

Figure 5:
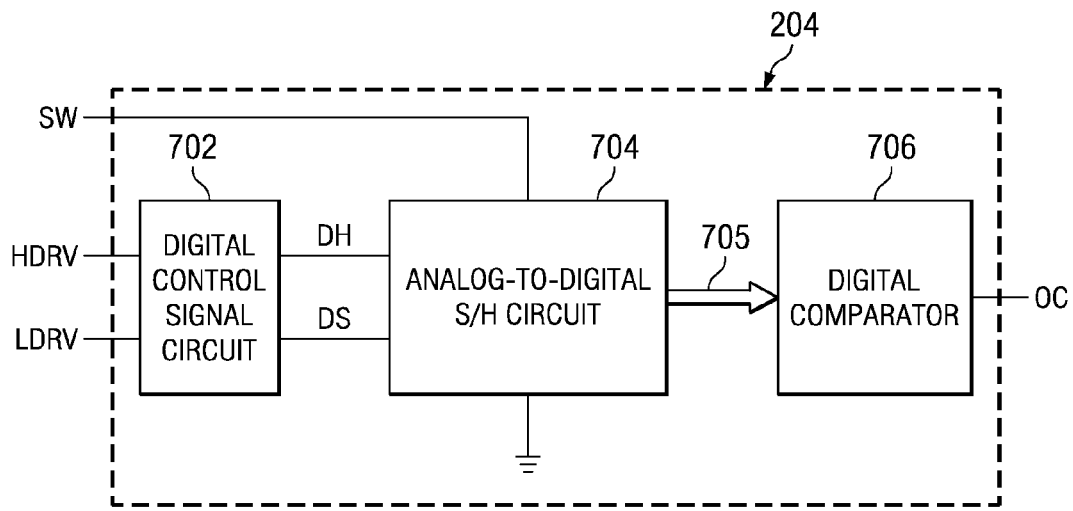
FIG. 5 is another block diagram of a portion of a controller of FIG. 1.

Alternatively, over-current circuit 204 can employ a "sample-and-hold" arrangement using digital components. As shown in FIG. 5, a digital over-current 302 generally comprises a digital signal control circuit 702, an analog-to-digital sample-and-hold circuit 704, and a digital comparator 706. The digital signal control circuit 702 is generally configured to receive the high-side and low-side drive signals HDRV and LDRV and generally outputs a digital hold DH signal and a digital sample DS signal. Additionally, the digital signal control circuit 702 may be a programmable device or configured from components, such as, for example, but not limited to, field programmable gate arrays (FPGA). The analog-to-digital S/H circuit 704 is generally configured to receive the digital hold and digital sample signals DH and DS as well as configured to be coupled to the node SW to detect a voltage thereon. The analog-to-digital S/H circuit 704 is also generally configured to convert the analog measurement of voltage found at the node SW to a digital output 705 for digital comparator 706 (which may also be an FPGA). The digital comparator 706 is generally configured to compare the digital output 705 from the analog-to-digital S/H circuit 704 to a pre-programmed and/or configured threshold value in order to provide an indication on the output OC representing whether or not an over-current condition has been detected or reached.

With the over-current circuit 204, a true inductor valley current (i.e., the lowest point or value) is sampled and compared because the current information is latched, sampled, or stored at the end of the low-side transistor ON cycle. As a result, consistent and accurate over-current sensing can be provided over a wide range of duty cycles at which the converter may operate. The current information is processed (i.e., compared, when the low-side transistor is OFF during the hold period), therefore, the comparator's 304 and 706 response time is not limited, nor the limiting factor, in high duty cycle applications.

Additionally, the system 100 can provide for a compact circuit implementation that provides a low cost solution for providing over-current protection in DC-DC converters. A symmetric and differential sample-and-hold circuit provided by system 100 can reduce clock feed-through and charge injection errors as seen in known sample-and-hold circuits. System 100 is also capable of operating in any mode, such as voltage mode, current mode, COT, D-Cap, and so forth.

Figure 6:
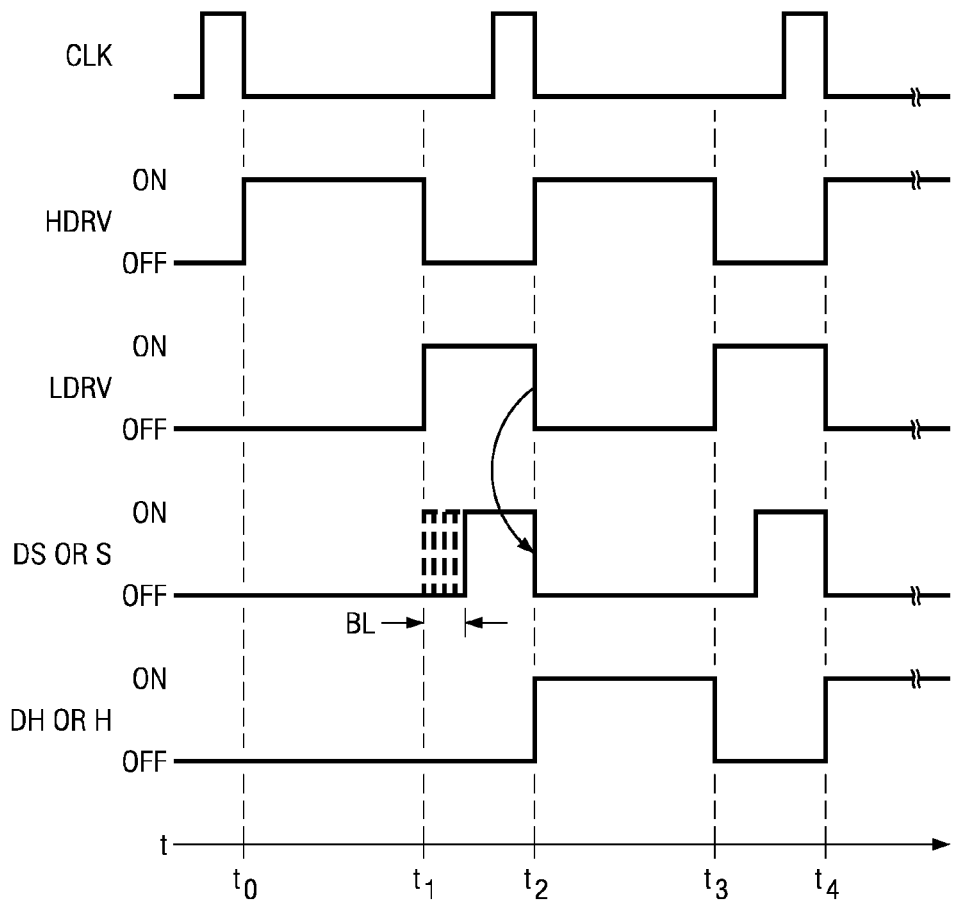
FIG. 6 is a timing diagram of the converter of FIG. 1.

Now, turning to FIG. 6, a timing diagram for the system 100 is shown. At time $t_0$ the high-side drive signal HDRV transitions to logic high on one the falling edge of the corresponding clock pulse of the clock signal CLK. With this transition of the high-side drive signal HDRV to logic high, high-side transistor 108 is switched ON or is actuated, allowing current to flow from the input node 104 to the inductor 112. At time $t_1$, the high-side drive signal HDRV transitions to logic low and the low-side drive signal LDRV transitions to logic high, deactuating high-side transistor 108 and actuating low-side transistor 110. Generally, the sample signal S (or DS) transitions to logic high, initiating a sample phase when the low-side drive signal LDRV transitions to logic high; however, a delay or blanking time BL may be present, which would delay the transition of the sample signal S (or DS) from logic low to logic high. During the sample period value at node SW is stored by S/H circuit 302 or 702 is latched or stored. At time $t_2$, high-side drive signal HDRV and hold signal H (or DH) transition from logic low to logic high, while the low-side drive signal LDRV and sample signal S (or DS) transition from logic high to logic low. During the hold period, the stored or latched value of node SW is transmitted to the comparator 304 (or 706). Based on the comparison of the value at node SW, the comparator 304 (or 706) can provide an over-current signal OC to the PWM logic 302 if the value at node SW exceed the over-current threshold OCTH so that the ON period (logic high period) for the high-side drive period HDRV and/or the low-side drive signal LDRV can be adjusted accordingly.

One reason for performing the "sample-and-hold" process is that a voltage drop at the switching node SW is generally representative or generally proportional to current being drawn by a load (which is generally coupled to the output node 106). As stated above, sampling is performed while the low-side transistor 110 is ON, and holding (and comparing with a threshold value) are performed while the low-side transistor 110 is OFF. Thus, this "sample-and-hold" allows for improved over-current condition detection irrespective of a duty cycle of the converter.

Figure 7:
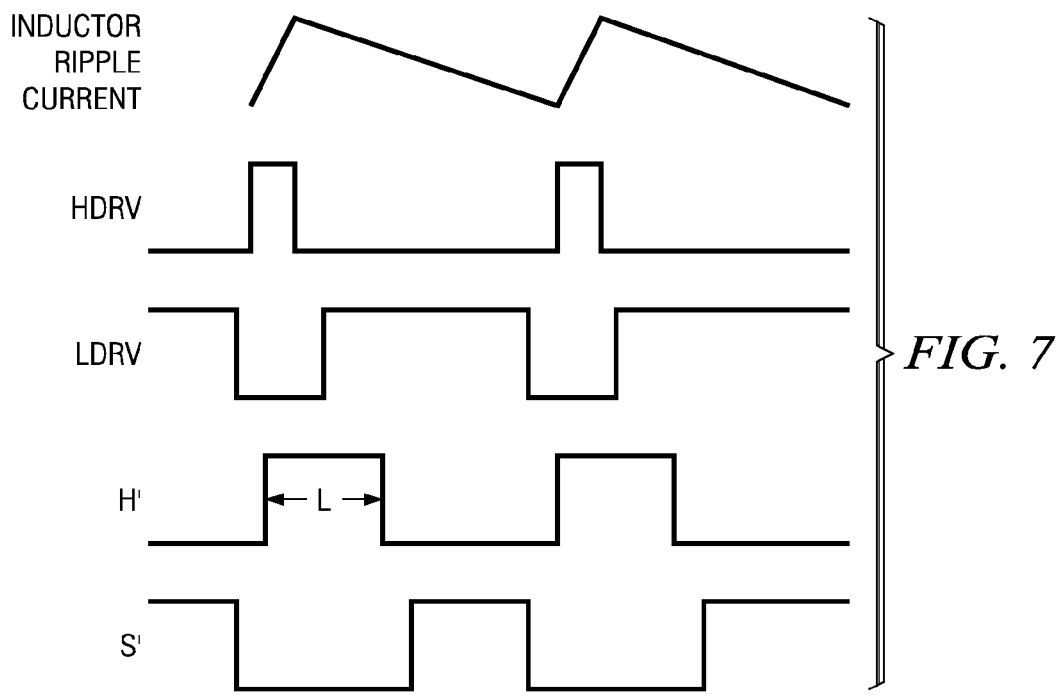
FIG. 7 is a timing diagram of the converter of FIG. 1 having a fixed hold and compare time in a system with a low duty cycle.

One other characteristic of system 100 is its ability to operate at extremely low duty cycles and high duty cycles. FIG. 7 illustrates a timing diagram depicting the operation of system 100 at low duty cycles, and FIG. 8 illustrates a timing diagram depicting the operation of system 100 at high duty cycles.

In FIG. 7, a fixed holding time duration L, for example 300 ns, is implemented so that the comparator 304 (or 706) can be provided with sufficient time to process (i.e., to compare) the held value to the threshold. A hold signal H' having the fixed time duration L is provided as a function of the switching frequency of the converter 100 and the designed response time of the comparator 304 (or 706). A sample signal S' is generated from the non-overlapped and out of phase hold signal H', which is logically ANDed with the low-side control signal LDRV. Thus, when the high-side signal HDRV is asserted, the hold signal H' is asserted for duration L (i.e., longer than the duration of the high-side signal HDRV), and during which time the hold value is compared to the threshold. After the duration L, the hold signal H' is de-asserted and the sample signal S' is asserted for that portion during which the hold signal H' is not asserted and the low-side signal LDRV is asserted.

Figure 8:
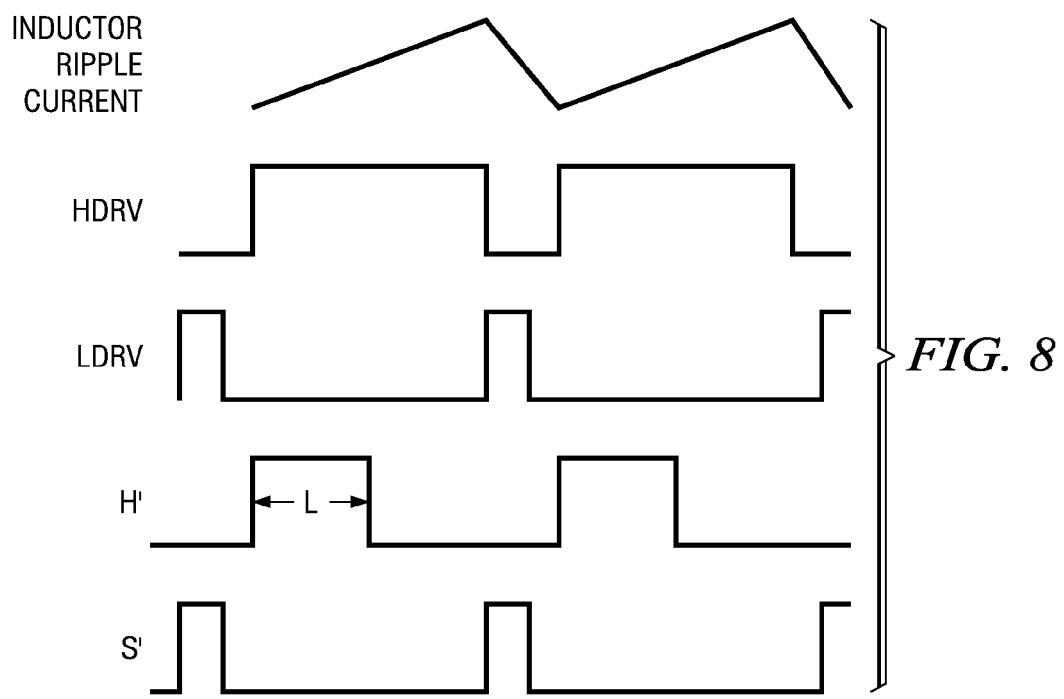
FIG. 8 is a timing diagram of the converter of FIG. 1 having a fixed hold and compare time in a system with a high duty cycle.

In FIG. 8, a hold signal H' having the fixed duration L is implemented. When the high-side drive signal HDRV is asserted, the hold signal H' is asserted for duration L, during which time the hold value is compared to the threshold. After the duration L, the hold signal H' is de-asserted and the sample signal S' is asserted for that portion of time during which the hold signal H' is not asserted and the low-side drive signal LDRV is asserted.

Further, while the foregoing describes detecting an over-current condition, alternate conditions are also detectable. In one example, the threshold value may be set to detect a short-circuit condition. In another example, the threshold value may be set not to detect over-current or short-circuit but, instead, to limit operation to some predetermined percentage of capacity less than over-current or short-circuit conditions. Still further, the threshold value may be changed "on-the-fly" so as to provide various current capacity as may be necessary according to a system's needs or design. It can also be used for the current information acquisition (i.e., not comparing with any thresholds).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus for converting a first voltage input at an input node to a second voltage that is output at an output node, the apparatus comprising:
    a first switch that is coupled to the input node;
    a second switch that is coupled to the first switch;
    an inductor that is coupled to a node between the first and second switches and that is coupled to the output node; and
    a controller including:
        a pulse width modulation (PWM) logic that is coupled to the first and the second switches and that generates actuation signals for the first and second switches;
        a sample-and-hold circuit that is coupled to the node between the first and second switches and that is coupled to the PWM logic, wherein the sample-and-hold circuit receives the actuation signals for the first and second switches; and
        a comparator that is coupled to the sample-and-hold circuit and that is coupled to the PWM logic, wherein the comparator compares an output from the sample-and-hold circuit to a predetermined threshold to determine whether the apparatus has reached an over-current condition, and wherein the comparator outputs an over-current signal to the PWM if the over-current condition has been reached.

2. The apparatus of claim 1, wherein the first and second switches are FETs.

3. The apparatus of claim 1, wherein the sample-and-hold circuit further comprises:
    a third switch that is coupled to the node between the first and the second switches;
    a fourth switch that is coupled to between the third switch and ground;
    a fifth switch that is coupled to the comparator;
    a sixth switch that is coupled between the fifth switch and ground;
    a capacitor that is coupled to a node between the third and fourth switches and that is coupled to a node between the fifth and sixth switches; and
    a signal control circuit that is coupled to the PWM logic and that is coupled to each of the third, forth, fifth, and sixth switches, wherein the signal control logic is adapted to issue a sample signal to the third and sixth switches to store an inductor current value on the capacitor, and wherein the signal control logic is adapted to issue a hold signal to the fourth and fifth switches to provide the inductor value stored on the capacitor to the comparator.

4. The apparatus of claim 1, wherein third, fourth, fifth, and sixth switches are FETs.

5. The apparatus of claim 1, wherein the comparator is an analog comparator.

6. The apparatus of claim 1, wherein the sample-and-hold circuit further comprises:
    digital signal control circuit that is coupled to the PWM logic; and
    an analog-to-digital sample-and-hold circuit that is coupled to the node between the first and second switches, the digital signal control circuit, and the comparator, wherein the comparator is a digital comparator.

7. The apparatus of claim 6, wherein the digital signal control circuit is a field programmable gate array (FPGA).

8. The apparatus of claim 1, wherein the apparatus further comprises a capacitor that is coupled between the output node and ground.

9. The apparatus of claim 1, wherein the apparatus further comprises a capacitor that is coupled between the input node and ground.

10. A controller for a DC-DC converter, the controller comprising:
    a pulse width modulation (PWM) logic that receives a clock signal and generates actuation signals;
    a sample-and-hold circuit that receives the actuation signals and that receives an inductor current value, wherein the sample-and-hold circuit is adapted to store and to output the inductor current value; and
    a comparator that receives the inductor current value from the sample-and-hold circuit, that compares the inductor current value to a predetermined threshold to determine whether the converter has reached an over-current condition, and that outputs an over-current signal to the PWM logic if the over-current condition has been reached.

11. The apparatus of claim 10, wherein the sample-and-hold circuit further comprises:
    a third switch that is coupled to the node between first and second switches;
    a fourth switch that is coupled to between the third switch and ground;
    a fifth switch that is coupled to the comparator;
    a sixth switch that is coupled between the fifth switch and ground;
    a capacitor that is coupled to a node between the third and fourth switches and that is coupled to a node between the fifth and sixth switches; and
    a signal control circuit that is coupled to the PWM logic and that is coupled to each of the third, forth, fifth, and sixth switches, wherein the signal control logic is adapted to issue a sample signal to the third and sixth switches to store an inductor current value on the capacitor, and wherein the signal control logic is adapted to issue a hold signal to the fourth and fifth switches to provide the inductor value stored on the capacitor to the comparator.

12. The apparatus of claim 10, wherein third, fourth, fifth, and sixth switches are FETs.

13. The apparatus of claim 10, wherein the comparator is a digital comparator.

14. The apparatus of claim 13, wherein the sample-and-hold circuit further comprises:
    digital signal control circuit that is coupled to the PWM logic; and
    an analog-to-digital sample-and-hold circuit that is coupled to the node between the first and second switches, the digital signal control circuit, and the digital comparator.

15. The apparatus of claim 14, wherein the digital signal control circuit is a field programmable gate array (FPGA).

16. A method for operating a DC-DC converter having a high-side transistor and a low-side transistor, the method comprising the steps of:
    actuating the low-side transistor;

sampling an inductor current value while the low-side transistor is actuated;

comparing the sampled inductor current value to a predetermined threshold to determine whether the converter has reached an over-current condition;

indicating the over-current condition to PWM logic when reached; and adjusting the ON times for at least one of the high-side and low-side transistors in response to the over-current condition.

17. The apparatus of claim 16, wherein the step of sampling the inductor current value while the low-side transistor is actuated further comprises the step of actuating first and second sample transistors to allow a capacitor to receive the inductor current value.

18. The apparatus of claim 16, wherein the step of method further comprises the step of actuating first and second hold transistors when the high-side transistor is actuated to allow a comparator to receive the sampled inductor current value.

* * * * *